United States Patent [19]

Wilcox

[11] 3,821,053

[45] June 28, 1974

[54] THERMOCOUPLE AND METHOD OF MAKING SAME

[75] Inventor: Paul D. Wilcox, Albuquerque, N. Mex.

[73] Assignee: The United States of America as represented by the United States Atomic Energy Commission, Washington, D.C.

[22] Filed: Sept. 20, 1972

[21] Appl. No.: 290,685

[52] U.S. Cl. ........................ 156/257, 29/573, 65/56, 136/202, 136/224, 156/288, 156/309

[51] Int. Cl. ...... B32b 31/00, B01j 17/00, H01v 1/00

[58] Field of Search ............ 156/89, 309, 306, 311, 156/288, 257; 136/202, 224, 225, 239; 29/573, 576, 589, 590, 581, 582; 65/56

[56] References Cited

UNITED STATES PATENTS

| | | | |
|---|---|---|---|
| 3,179,545 | 4/1965 | Bowers | 156/89 |
| 3,271,632 | 9/1966 | Hartman | 29/582 |
| 3,355,636 | 11/1967 | Becke | 29/576 J |
| 3,483,052 | 12/1969 | Seidel et al. | 156/89 |
| 3,626,583 | 12/1971 | Abbott et al. | 136/212 |

*Primary Examiner*—Douglas J. Drummond
*Attorney, Agent, or Firm*—John A. Horan; Dudley W. King

[57] ABSTRACT

A method for making thermocouples and the thermocouples produced thereby including superposing an elongate conductive member and a normally solid, electrically insulative and binder material between first and second layers of thermoelectric material, heating the sandwiched assembly to at least partially liquidize or soften the insulative material and pressing the conductive member against the thermoelectric material layers, continuing the heating and pressing to join or react the conductive member with the thermoelectric material layers and wet the thermoelectric materials and conductive member surfaces in contact with liquidized insulative material, and then cooling the materials to solidify and bind the same together. The thermoelectric materials are of different conductivity types and additional layers of insulative materials, conductive members and thermoelectric materials of alternating conductivity types may be stacked and pressed and heated.

9 Claims, 9 Drawing Figures

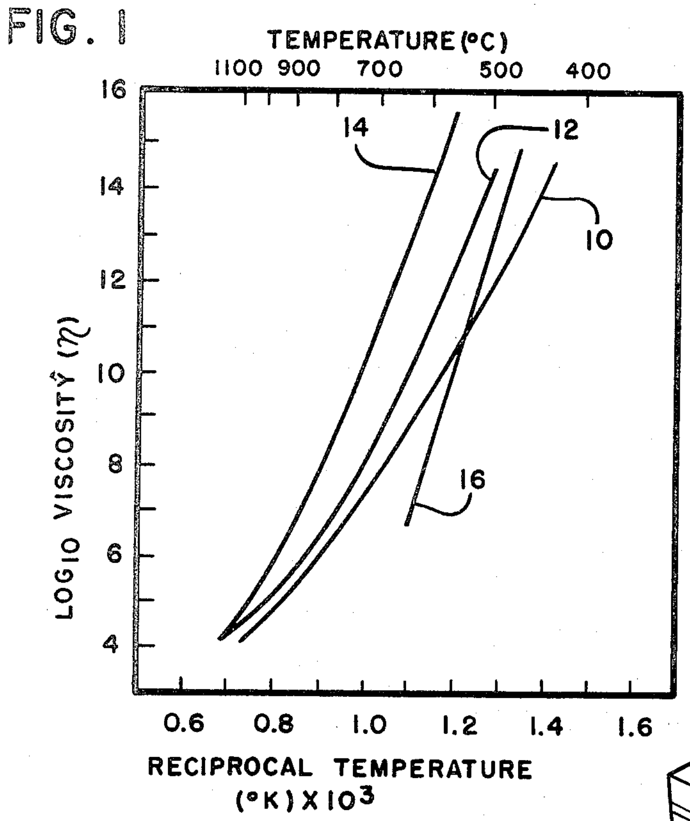
FIG. 3
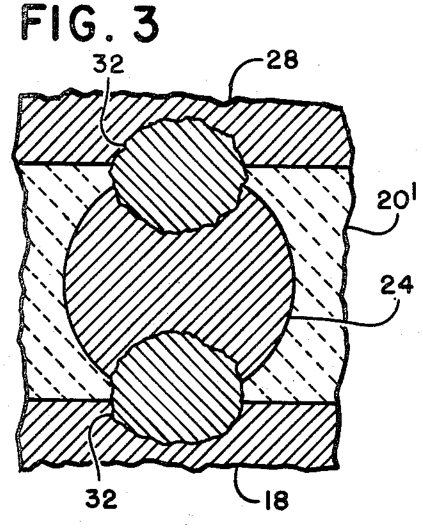
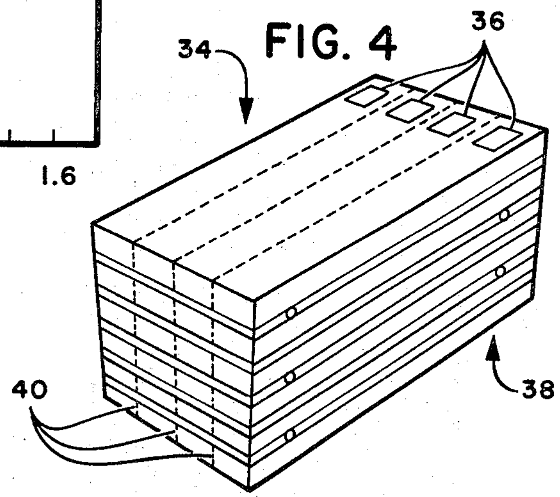
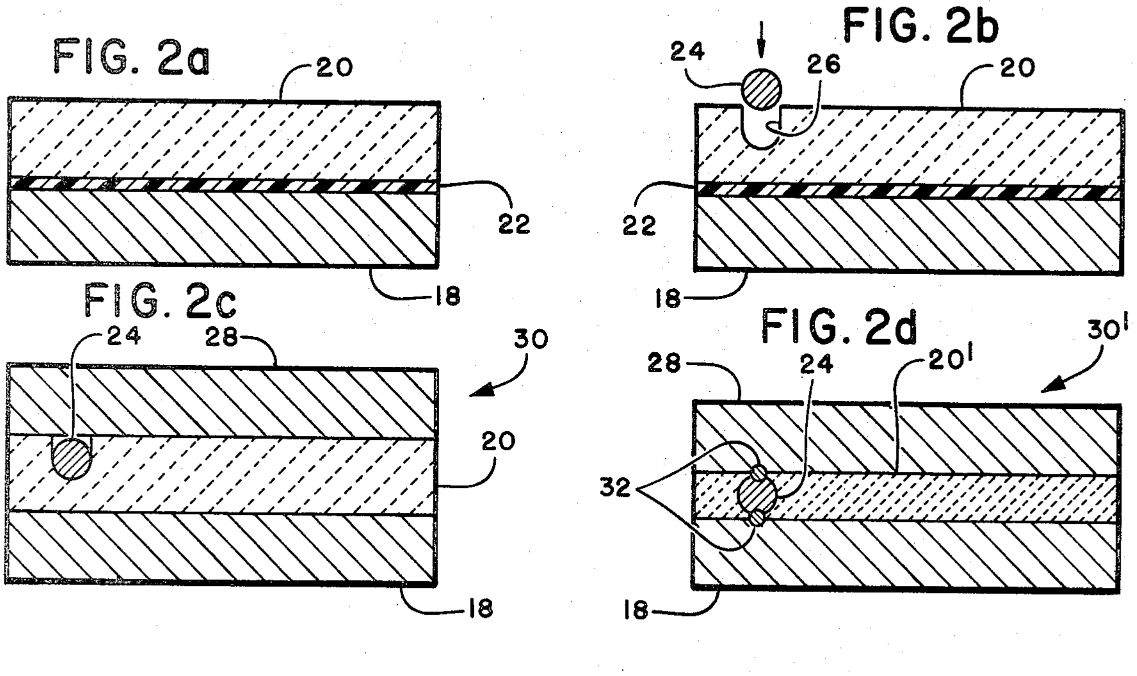

THERMOCOUPLE AND METHOD OF MAKING SAME

BACKGROUND OF INVENTION

Thermoelectric couples or thermocouples are commonly made from pairs of opposite conductivity type of semiconductor material, namely N-type and P-type conductivities, which are electrically connected together at one end. The thermocouple is appropriately heated and/or cooled to produce an electrical current and voltage. Each thermocouple generally produces some particular voltage level at a given operating temperature gradient and combination of materials with the current produced being a function of the cross-sectional area of the thermoelectric material. Thus, in order to increase the voltage produced by these materials at a particular temperature gradient many thermocouples need to be connected in electrical series to form a thermoelectric module or a thermopile. A thermopile may be made from any number of appropriate conductivity type semiconductor pairs depending upon the operating conditions of the devices and their desired outputs. For high temperature applications, silicon-germanium (Si-Ge) is often used with appropriate doping materials to form the desired P and N type semiconductor materials.

In connecting the thermoelectric materials to form individual couples or a composite thermopile, an electrical contact must be made between each thermocouple pair at either the hot or cold junction to form a low resistance electrical path which is stable and reliable over the operating conditions and life of the thermocouple of thermopile. Many previous schemes to provide such electrical connections have been both complicated and difficult to manufacuture, and in many instances very unreliable and restricted as to temperature of use or magnitude of thermal gradient. As the need has developed to form these thermocouples and thermopiles to be efficient and reliable, requirements have developed to minimize the size and weight of such thermocouples or thermopiles together with increasing demands for higher temperature and longer term use. All of these requirements tend to complicate and make more difficult the manufacture of such devices and the resulting products.

In prior attempts to manufacture thermocouples for long term thermopile operations, matrices of blocks, rods or slices of thermoelectric material have been bonded together and electrical connections applied to the exterior surface of the finished matrices to achieve the series connection of the respective thermocouples. The manufacture of the matrices themselves as well as the subsequent electroding operations have been difficult to achieve with a very low percentage of successful thermopiles being produced. Those thermopiles which have been produced have not been capable of providing long term operations, namely up to 10 years or more under potentially high temperature (such as about 450° C and above) conditions.

SUMMARY OF INVENTION

It is an object of this invention to provide a new thermocouple arrangement, and method of making which is structurally strong and which has low resistance and reliable electrical connections between the thermoelectric materials.

It is a further object of this invention to provide such a thermocouple and method in which the thermoelectric and electrical interconnections are assembled and bound together in a single operation.

It is a further object of this invention to provide a thermopile of such thermocouples, the entire thermopile being assembled in the same operation of forming individual thermocouples and their interconnections.

It is a further object of this invention to provide such thermocouples and thermopiles which are operable over long term usage at high temperatures.

Various other objects and advantages will appear from the following description of the invention and the most novel features will be practicularly pointed out hereinafter in connection with the appended claims. It will be understood that various changes in the details, materials and arrangements of the parts which are herein described and illustrated in order to explain the nature of the invention may be made by those skilled in the art.

This invention relates to a method of forming a thermocouple or thermopile in which thermoelectric materials are bonded to an intermediate insulating material layer while simultaneously pressing an elongated conductive member through or so as to penetrate the insulative layer against both thermoelectric materials, the thermoelectric materials bonding or reacting with the conductor during formation of the bond.

DESCRIPTION OF DRAWING

Various aspects of this invention are illustrated in the accompanying drawing wherein:

FIG. 1 is a graph showing the viscosity characteristics of several insulative materials useful in bonding the thermcouple of this invention;

FIGS. 2(*a*), (*b*), (*c*) and (*d*) are a series of cross sectional views showing the sequence of steps used to form a thermocouple or thermopile in accordance with this invention.

FIG. 3 is an expanded or greatly enlarged view of a portion of the thermocouple showing the electrical connection between the conductive member and the thermoelectric materials;

FIG. 4 is a perspective view of a stack of thermocouples or a thermopile formed in accordance with the sequence of steps of in FIG. 2 which may be sliced into a plurality of separate thermopiles;

DETAILED DESCRIPTION

Figure 5:
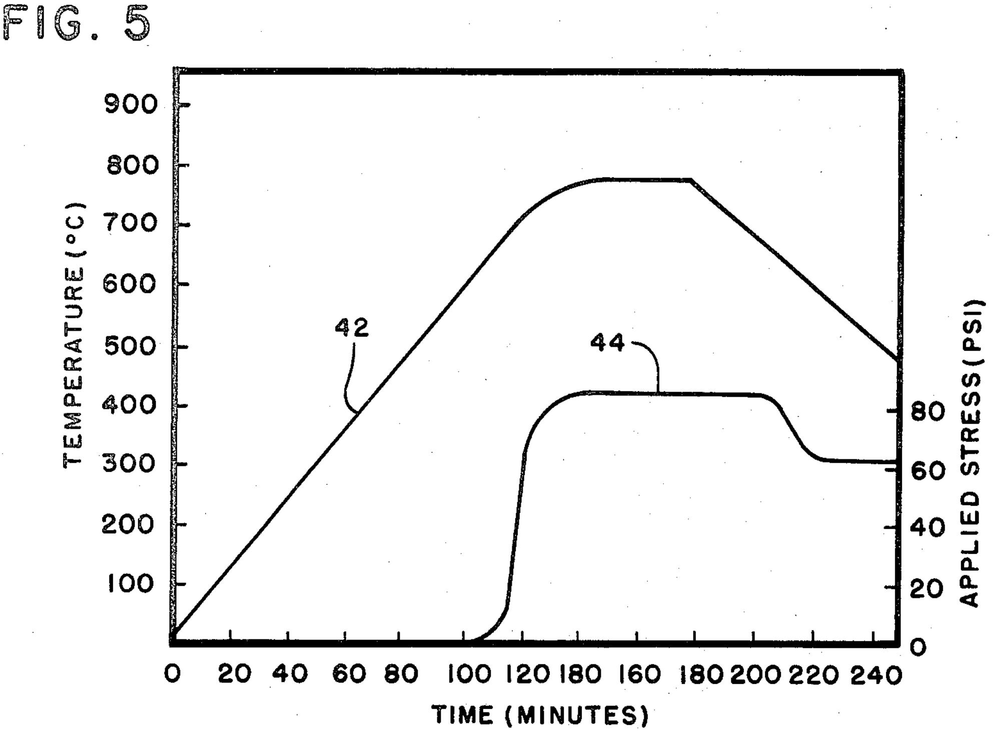
FIG. 5 is a graph showing typical temperature and pressure curves for the hot-pressing of a thermopile in accordance with this invention using a particular glass insulative material.

The thermoelectric couples of this invention may be made from any appropriate combination of thermoelectric materials, insulative materials and conductive materials which are compatible under the desired operating conditions and which will provide the desired output. The particular thermoelectric material being used will generally dictate the family of conductive and insulative materials that may be used, though the environmental conditions of thermocouple use may very often affect this selection. For example, it has been found for those applications where the thermocouples are to be operated at hot junction temperatures of about 450°C, electrical power outputs may be achieved over extended periods of time using appropriately doped silicon-germanium semiconductor thermoelectric materials. The electrically insulative material (which is also used between the Si-Ge material to bond the same together) for such applications must maintain its insulative qualities and bonding strength under these operating conditions without extensive detrimental diffusion of impurities from the insulative material into the thermoelectric material; some constituents of insulative materials may act as doping agents in thermoelectric semiconductors and change their thermoelectric or electrical characteristics. At these operating temperatures, diffusion of constituents may readily occur from some materials. Likewise, the conductor materials must also be able to withstand these temperatures without excessive diffusion or reaction with either the thermoelectric or insulative material.

For purpose of illustration and in order to describe a preferred combination of thermocouple materials which do form a particularly high strength thermocouple or thermopile with a high degree of reliability and repeatability in relatively short processing time, a Si-Ge thermocouple together with certain conductive and insulative materials will be described hereinafter. The resulting thermocouples or thermopiles may produce useful electrical power over a lifetime of greater than 10 years at a hot junction temperature up to 450°C produced from a radioactive heat source.

The Si-Ge thermoelectric material may be formed in any appropriate known manner by hot-pressing, that is under simultaneous application of heat and pressure, a mixture or alloy of silicon and germanium together with the desired doping agent to form a slug or block of the alloy. The Si-Ge alloy doping may typically be achieved with materials like boron and phosphorous or arsenic or combinations thereof to provide some desired level of resistivity for a particular alloy percentage. The silicon in the Si-Ge alloy may vary from about 50 to 95 weight percent for many applications, with 80 weight percent Si providing good thermoelectric properties at higher temperatures. As the resistivity of the alloy is increased, the Seebeck coefficient may increase sufficiently to provide good electrical power outputs in a desired size of thermoelectric material at prescribed operating temperatures and thermal conditions which is readily fabricated in a thermocouple or thermopile. Thus, with higher resistivity material, a relatively small and easily made thermocouple or thermopile may be formed to provide a desired power output. For Si-Ge thermoelectric material (80 percent silicon by weight) of N-type material with a phosphorous dopant of about $2 \times 10^{19}$ carriers/cubic centimeter (carriers/cc), the resisitivity may be about $4.8 \times 10^{-3}$ ohm-centimeter whereas with a doping level of about $10^{20}$ carriers/cc the resistivity may be about $0.92 \times 10^{-3}$ ohm-centimeter. With the same alloy level and a boron doping of similar amounts, the P-type high resistivity material may be formed having a resistivity of about $5.4 \times 10^{-3}$ ohm-centimeter while low resistivity material may be at about $0.93 \times 10^{-3}$ ohm-centimeter. The Seebeck coefficients for these materials are about 256, 227, 115, and 105 microvolts/°C, respectively. Comparable electrical power may be produced by the high resistivity material using thermoelectrical bodies having a more easily formed cross sectional area.

After the appropriately doped Si-Ge thermoelectric slugs are formed, they may be lapped and ground to appropriate dimensions and wafers or plates of material then sliced from the slug; wafers of the higher resistivity material listed above may typically have thickness of, for example, about 7 mils, while wafers of the lower resistivity materials may typically have thicknesses of about 2 mils. The wafers or plates may then be lapped or ground or otherwise shaped to desired dimensions, the width and length dimensions generally not being critical at this stage of the process.

The insulative material used should exhibit a thermal expansion characteristic similar to the Si-Ge alloy and should provide good bonding strength at the operating temperature of the device. In addition, as noted above, the insulative material should not interfere with the thermoelectric material from adverse diffusion of constituents therefrom and should exhibit a desired level of viscosity during the processing to permit pressing of the conductive material through the insulative material against and for reaction with the thermoelectric materials, as described below, and to sufficiently wet all or a portion of the surfaces of the thermoelectric material and conductive material to provide a good bond therewith after solidification. It has been found that various glasses or glass ceramics and the like exhibit these characteristics. Typical viscosity characteristics for several examples of suitable glasses and a glass ceramic are shown in FIG. 1 (temperature being shown on a reciprocal scale). Curve 10 represents a borosilicate sealing glass, curve 12 is for a borosilicate glass and curve 14 is for a barium aluminum borosilicate glass, all which exhibit viscosity, thermal expansion and bonding strength characteristics suitable for this invention. It is understood that other glasses having similar characteristics may be used in these thermocouples and process. It has been found that the preferential viscosity level of the insulative material at processing temperatures is at a logarithm of viscosity of from about 6 to 7, generally around 6.6, in many applications of the present process. Curve 16 shows a typical viscosity change with increasing temperature for a glass ceramic material or crystallizing solder glass (made generally from oxides of Zn, Si, B, Pb and Cu) below the crystallization temperature of the material. As a glass ceramic is crystallized, its characteristics are changed toward that of a ceramic and exhibits such properties including higher strength and electrical resistance, lower thermal expansion coefficients, etc. over that of comparable glasses. Typically, a glass ceramic under a temperature environment that is increasing will first soften or melt and then, at a higher temperature, nucleate, crystallize and thicken, and at a still higher temperature become soft again and even liquidize. Some of the physical and electrical characteristics of these glasses are illustrated in the following table.

| | Glass (Curve Number from FIG. 1) | | | |
|---|---|---|---|---|
| | 10 | 12 | 14 | 16 |
| Thermal Coefficient of Expansion ($10^{-7}$/inch/°C) | 46 | 36 | 46.7 | 32 |
| Softening Point (°C) | 710 | 755 | 842 | 632* |
| Young's Modulus ($10^6$ pounds/square inch) | 8.2 | 9.1 | 9.8 | — |
| Dielectric Constant (at 1MHz & 20°C) | 4.9 | 4.7 | — | 7.0 |
| Volume Resistivity ($Log_{10}$ at 350°C) | 7.4 | 7.2 | 11.7 | 11.0 |

*Before crystallization.

Other suitable insulative materials may be used to achieve the desired properties including such as an oxidized layer formed on each of the thermoelectric materials adjoining surfaces when appropriate.

The glass or glass ceramic or other insulative material may be used in the form of a sheet or as a powder. In the form of a powder, the glass may be utilized by silk screening a slurry of glass powder onto the thermoelectric material or it may be applied using a transfer tape in which the glass is disposed between two protective layers with an adhesive layer along one surface of the glass powder against one of the protective layers. The protective layer adjacent the adhesive layer may first be removed and the glass and adhesive applied to the thermoelectric material and the other protective layer then removed. The glass powder may generally be in particle sizes less than the glass layer thickness after compression, such as about 200 U.S. Standard mesh with a glass powder having an initial thickness of about 8 mils and compressed thickness of about 3.8 mils with smaller particle sizes for thinner tape. The glass may be applied so as to entirely cover mating surfaces of the thermoelectric material or sufficient portions thereof (such as in bands or with controlled porosity) to provide strength while limiting thermal losses from thermal conductivity through the glass.

The adhesive layer may be made of any appropriate material which will adhere to the glass particles or powders and hold them together and which will volatilize at a temperature below the temperatures used in the later formation of the thermocouple or thermopile.

The conductive material or members used should be such that will provide a high level of electrical conductivity during the operating life of the thermocouple or thermopile and which will not unduly react with the other materials under the processing and operating conditions of the device. Particularly appropriate materials for such use are platinum, platinumrhodium alloys and similar materials. The conductive material may be in the form of a ribbon or foil though for purposes of this invention a generally arcuate or round wire may be preferred for reasons which will become apparent below. The conductive wire or other form of conductive member may first be annealed, such as for platinum at about 1000°C, for ease of handling and forming of the conductive member into any desired shapes.

After selection of the desired materials and forms thereof, they may be assembled into a thermocouple or thermopile in the general process steps and sequence illustrated in FIG. 2. The respective materials are shown with exaggerated thicknesses for purpose of illustration. A wafer or plate 18 of N or P type doped thermoelectric material, prepared as described generally above in appropriate shape and thickness (for high resistivity Si-Ge material such as at about 7 mils in thickness and about 1 inch by 0.7 inch in length and width), may first be covered at least partially over one of its major surfaces with a layer 20 of the electrically insulative material, as shown in FIG. 2(*a*). With layer 20 as a glass powder of about 325 U.S. Standard mesh in the form of a glass tape having an adhesive layer 22 pressed against plate 18, the glass particles may be at an initial thickness of about 8 mils for the example being described. The glass layer 20 as a tape is shown with the protective layers removed. After application of the glass layer 20 against plate 18, the adhesive layer 22 may be volatilized and removed by heating to an appropriate temperature, such as from about 400° to about 500°C at a heating rate of from about 20° to 50°C/hour, to remove greater than 90 percent or more of the binder depending upon the constituents of the layer 22, leaving only the plate 18 and the layer 20. The binder may be burned out, if desired, during the later heating cycle described below. A wire 24 or other form of elongated conductive member may then be disposed along or positioned over the glass layer 20 adjacent one end of the plate 18 and generally parallel to that end. The wire 24 may be of any appropriate length, such as, as long as or longer than the dimension of the plate 18 along which it is disposed. For convenience of processing it has been found that it is often desirable to first cut or otherwise impress a groove or slot 26 partially or, if desired, completely through the glass layer 20, by suitable application of a sharp edge against layer 20 or the like, to aid in emplacement of the wire 24 and the maintenance of wire 25 in its desired location and orientation, as shown in FIG. 2(*b*). In the particular example of materials described, the wire 24 may have a diameter of about 5 mils with a groove 26 of about 5 mils in depth. When a groove 26 is provided, the wire 24 may be pressed into groove 26 either prior to or after application of the volatilization step. Also, the insulative material layer 20 may first be heat treated as described below to soften, liquify and bond the same to plate 18 and then, after solidification, a groove 26 cut or abraded therein and wire 24 appropriately positioned in the groove before proceeding to the next step.

An additional wafer or plate 28 of thermoelectric material of similar shape and dimension may then be placed over glass layer 20 and conductive memebr 24 so as to overlie the same with edges of the plate 28 generally coextensive with the edges of the plate 18, as shown in FIG. 2(*c*). Plate 28 should have a conductivity opposite to that of plate 18, i.e., if plate 18 is of P-type thermoelectric material plate 28 should be of N-type thermoelectric material and vice versa. The sandwiched assembly of plates 18 and 28 with glass layer 20 and conductive member 24 disposed therebetween may then be subjected to appropriate temperatures and pressure to form the desired thermocouple. The temperatures and pressures used and their profile or sequence may vary somewhat depending upon the particular materials used for each of the portions of the sandwich assembly and the form and composition of glass layer 20. For the materials specified using a glass powder for layer 20 of the type illustrated by curve 12 of FIG. 1 and a platinum wire 24, the assembly may be heated to a temperature of from about 700° to 800°C in a rise time of about 1.5 hours. A pressure of from a few pounds to about 100 pounds per square inch (psi) may be applied after about 5 to 10 minutes of heating, or later, and held at that level until near the time when the temperature has been maintained for about 10 to 60 minutes at its maximum level. It may be preferred to apply the pressure after the insulative material has softened sufficiently to improve distribution of loads and stresses.

During the heating and pressing of assembly 30, the glass layer 20 will begin to soften (its viscosity lowered) and then at least partially liquify or melt at some temperature depending upon the glass characteristics. With the pressure applied normal to plates 18 and 28, the glass will be compressed and the wire or conductive member 24 pushed through layer 20 if it is not already therethrough. The generally arcuate or circular shape of wire 24, as illustrated, will tend to travel through the soft or partially liquidized glass 20 more readily than a foil or ribbon, though any shape which is curved or sloped with respect to the direction of pressing may provide such a function. As the temperature and pressure continues the glass particles may coalesce and compress to the point where conductive member 24 comes into contact with plate 18, if not previously in such contact, as shown in FIG. 2(*d*). With a properly selected temperature, conductive member 24 will interbond or react with thermoelectric plates 18 and 28 to form the reaction zones 32 when glass layer 20 in its compressed form 20', as shown in greater detail in FIG. 3, to insure electrical contact between the conductor and thermoelectric layers. These reaction zones 32 may include some form of the compounds of platinum and/or rhodium with silicon and germanium, with the materials specified. With the continued heating of the compressed assembly 30' at desired levels, the surfaces of plates 18 and 28 in contact with layer 20' and conductive member 24 and reaction zones 32, will be wetted by the liquidized or partially liquidized glass layer 20'. Some glass may be partially extruded around the edges of plates 18 and 28 (not shown). After the liquification and wetting steps and the conductive member-thermoelectric plate reactions have proceeded to a sufficient degree, the pressure and temperatures may be reduced and eventually removed as the compressed assembly 30' returns to room temperature. The sides and ends of the compressed assembly 30' may then be ground or lapped or otherwise finished to remove excess glass or other materials and to achieve desired final dimensions. The compressed assembly 30' may in this condition form the completed thermocouple. The assembly 30 and portions thereof may be held in the positions shown by appropriate jigs and fixtures.

Additional thermoelectic plates of alternating conductivities and glass layers with conductive members may be stacked over the assembly 30 prior to the hot pressing sequence and the entire stack hot-pressed at the same time to form a compressed assembly and thermopile. In such an arrangement, besides alternating the conductivity of the adjoining thermoelectric plates and positioning glass or insulative layers between each thermoelectric plate, the conductive members between each layer may be disposed at alternating opposite ends of the assembly so as to provide a series connection of the respective thermoelectric plates in the finished thermopile. Such a compressed thermocouple stack or thermopile is shown in FIG. 4 by thermopile 34 which includes three layers each of P and N-type thermoelectric plates.

The conductive members themselves may be used to provide electrical connection to the thermocouple or thermopile by using an end or ends of conductive members extending from the thermocouple or thermopile or by attaching a lead to the extended or flush end of the conductive member in an appropriate manner. In such arrangements, however, the outer thermoelectric plates will not contribute to the electrical output but may form a temperature gradient barrier to enhance the uniformity of temperatures through the thermopile. If the outer thermoelectric plates are used in the electrical system to increase device efficiency by decreasing thermal losses, a conductive lead may be attached to the outside plate at an end opposite to the last conductive member, such as shown by leads 36 and by other leads (not shown) with positions indicated by arrow 38. These leads may be applied in any conventional manner, such as by sputting deposition or the like. If desired, the finished thermocouple assembly 30' or the thermopile 34 may be sliced or otherwise cut into a plurality of elongated thermocouples or thermopiles, such as along the dotted lines 40 in FIG. 4 each of the resulting thermocouples or thermopiles being complete in itself. Using the above-mentioned plate dimensions, four thermopiles may be sliced from the assembly 34 in separate stacks of about 0.140 inches in width.

Figure 6:
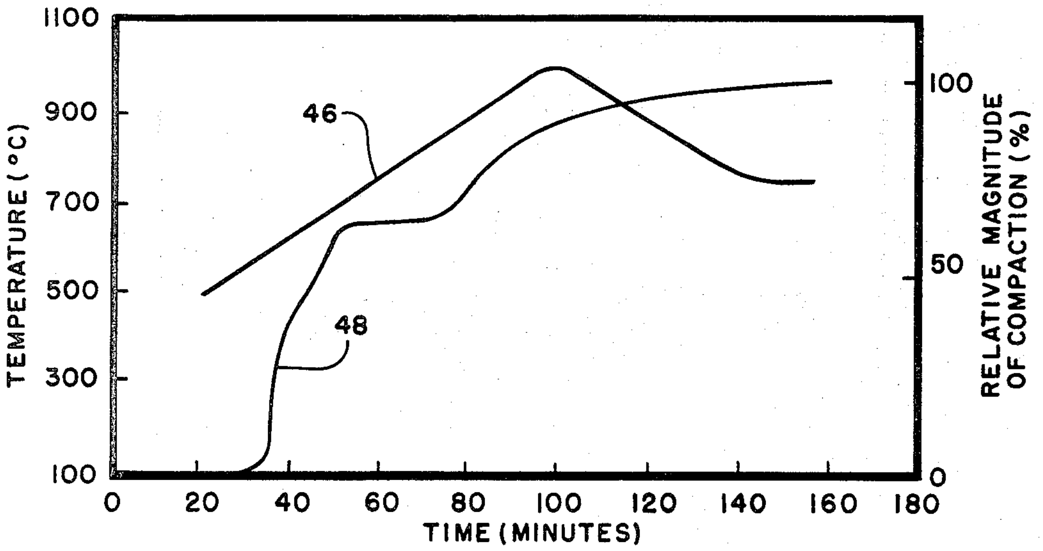
FIG. 6 is a graph showing the applied temperature and the resulting compaction of a thermopile using a crystallized glass or glass ceramic as an insulative material.

A typical heating and pressing sequence which is useable for a glass of the type shown by curve 12 in FIG. 1 as a glass powder tape together with a platinum wire conductive member is shown in FIG. 5. Curve 42 illustrates the temperature profile while curve 44 illustrates the pressure profile. It has been found that the platinum will react sufficiently at 750° to 800°C with the thermoelectric material of Si-Ge in a period of about 20 minutes to achieve the desired contact strength and resistance. For example, typical contact resistances of about $20 \times 10^{-3}$ ohm-centimeters have been achieved. A typical temperature and compaction profile for an assembly 34 using glass ceramic powder of the type shown by curve 16 in FIG. 1 is illustrated in FIG. 6. A pressure of about 50 pounds per square inch was applied after about 30 minutes of heating. The temperature profile is shown by curve 46 with the compaction profile shown by curve 48. As noted from curve 48 the glass ceramic first softens and compresses until it reaches the nucleation and recrystallization temperature at which time the compaction rate decreases. When the crystallization is complete the glass is non-yielding until it reaches another temperature level at which it again softens. When the assembly is cooled, the glass contracts to the final dimension. Since the platinum-rhodium alloys will react with the thermoelectric materials at higher temperatures than platinum alone, the glass ceramic insulating materials may be attractive for this application since they may be heated to above their crystallization temperature at which point the platinum-rhodium will react with the thermoelectric material. The resulting thermocouples or thermopiles may have higher strength and may permit higher operating temperatures without further reaction of the conductive member with the thermoelectric materials. The resulting glass ceramic thermopile may be subsequently processed, if desired, at relatively high temperatures, i.e., the crystallization temperature of the glass ceramic, without degradation of bonding strengths, etc. for such purposes as application of additional glass insulating layers to the exterior of the completed thermopile. Extensive reaction of the conductive member may cause a device to fail under some circumstances. Thus, the glass ceramic may extend the upper level of operating temperatures of the thermoelectric device. Platinum reacts in this process with Si-Ge at temperatures of from about 750° to 810°C while platinum - 20 percent rhodium reacts at temperatures of from about 900° to 975°C.

Thermopiles have been made having normal outer dimensions of about 0.14 inch wide by 0.50 inch stack height by 1.07 inch long and include 22 thermocouples formed from high resistivity Si-Ge. Thus, the thermocouple includes 22 P-type thermoelectric plates, 22 N-type thermoelectric plates and 43 glass layers and platinum wires. Such a thermopile when heated by an isotopically powered heat source to 380°C at the hot junction may produce $25 \times 10^{-3}$ watts of electrical power at 4 volts open circuit (2 volts under load) for more than 10 years.

What is claimed is:

1. A method for making unitary thermoelectric couples comprising covering at least a portion of a surface of a first thermoelectric material having a desired conductivity type with a layer of electrically insulative and binder material normally solid at operating temperatures of said thermoelectric couple; positioning an elongate electrically conductive member over said insulative material adjacent one end of said thermoelectric material; positioning a second thermoelectric material having a conductivity type opposite to said first thermoelectric material with a surface overlying said first material surface, insulative material and conductive member to form a sandwiched assembly; heating said assembly to at least partially soften said insulative material; compressing said assembly to force said conductive member firmly into contact with each of said thermoelectric materials; heating said assembly to interbond contiguous portions of said conductive member and said thermoelectric materials and wet said conductive member and said overlying surfaces of said thermoelectric materials with said insulative material for interbonding thereof; and cooling the resulting compressed assembly.

2. The method of claim 1 wherein said electrically insulative and binder material layer comprises a glass having a logarithm of viscosity of about 6 to 7 at said compressing and heating.

3. The method of claim 2 wherein said glass is in the form of particles having a size less than said glass layer thickness after said compression.

4. The method of claim 3 including the step of cutting a groove in said glass layer and positioning and pressing said elongate conductive member into said groove.

5. The method of claim 2 wherein said glass is a glass ceramic.

6. The method of claim 5 wherein said continued heating is to a temperature above the crystallization temperature of said glass ceramic.

7. The method of claim 1 wherein said conductive member is a wire selected from the group consisting of platinum and platinum-rhodium alloys and reacts with said thermoelectric materials during said heating.

8. The method of claim 1 wherein said thermoelectric materials comprise thin heat conducting plates.

9. The method of claim 1 wherein said thermoelectric materials are of N-type and P-type, and including stacking additional alternating layers of N-type and P-type thermoelectric materials with said first and second materials, with intermediate layers of said insulative material, and with a conductive member disposed between each of said thermoelectric materials at alternating opposite ends of said thermoelectric materials, together with heating and compressing together all of said layers to form a unitary stack.

* * * * *